(12) United States Patent
Edelstein

(10) Patent No.: US 9,245,617 B2
(45) Date of Patent: *Jan. 26, 2016

(54) NONVOLATILE MEMORY CELLS PROGRAMABLE BY PHASE CHANGE AND METHOD

(71) Applicant: U.S. Army Research Laboratory, Washington, DC (US)

(72) Inventor: Alan S. Edelstein, Alexandria, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/469,995

(22) Filed: Aug. 27, 2014

(65) Prior Publication Data

US 2015/0170739 A1    Jun. 18, 2015

Related U.S. Application Data

(63) Continuation-in-part of application No. 14/109,398, filed on Dec. 17, 2013, now Pat. No. 8,824,200.

(51) Int. Cl.
*G11C 11/00* (2006.01)
*G11C 13/00* (2006.01)
(Continued)

(52) U.S. Cl.
CPC ............ *G11C 13/0004* (2013.01); *G11C 11/16* (2013.01); *G11C 11/161* (2013.01); *G11C 11/1675* (2013.01); *G11C 13/0061* (2013.01);
(Continued)

(58) Field of Classification Search
CPC ....... G11C 11/16; G11C 11/56; G11C 11/161

USPC .......................... 365/158, 171, 173, 163, 148
See application file for complete search history.

(56) References Cited

U.S. PATENT DOCUMENTS 4,021,728 A    5/1977  Makino et al.
5,204,192 A    4/1993  Naksamura et al.
(Continued)

OTHER PUBLICATIONS

Lai, s, et al., "OUM—A 180 nm Nonvolatile Memory Cell Element Technology for Stand Alone and Embedded Applications" Intel Corporation, RN3-0 1 2200 Mission College Blvd Santa Clara, CA 95052-8 119, DOI:10.1109/IEDM.2001.979636 In proceeding of: Electron Devices Meeting, 2001. IEDM Technical Digest. International, IEEE Explore (2001).

(Continued)

*Primary Examiner* — David Lam
(74) *Attorney, Agent, or Firm* — Lawrence E. Anderson

(57) ABSTRACT

A nonvolatile memory comprising at least one ferromagnetic region having permittivity which changes from a first state to a second state of lower permittivity upon heating; at least one heater operatively associated with the at least one ferromagnetic region which selectively provides heat to the ferromagnetic region to change its permittivity; and a plurality of connectors operatively connected to the at least one heater and adapted to be connected to a current source that provides a current which causes the heater to change the at least one ferromagnetic region from a first state to a second state. Optionally, the memory is arranged as an array of memory cells. Optionally, each cell has a magnetic field sensor operatively associated therewith. Optionally, the nonvolatile memory is radiation hard. Also, a method of recording data by heating at least one ferromagnetic region to change its permittivity.

20 Claims, 13 Drawing Sheets

(51) Int. Cl.
  *G11C 11/16* (2006.01)
  *H01L 27/22* (2006.01)
(52) U.S. Cl.
  CPC .......... *G11C 13/0069* (2013.01); *H01L 27/222* (2013.01); *G11C 2013/008* (2013.01); *G11C 2013/0078* (2013.01); *G11C 2013/0092* (2013.01)

(56) References Cited

U.S. PATENT DOCUMENTS

| | | | |
|---|---|---|---|
| 5,293,031 | A | 3/1994 | Goto et al. |
| 5,764,567 | A | 6/1998 | Parkin |
| 6,072,382 | A | 6/2000 | Daughton et al. |
| 6,330,136 | B1 | 12/2001 | Wang et al. |
| 6,331,364 | B1 | 12/2001 | Baglin et al. |
| 6,349,053 | B1 | 2/2002 | Daughton et al. |
| 6,381,171 | B1 | 4/2002 | Inomata et al. |
| 6,383,597 | B1 | 5/2002 | Fullerton et al. |
| 6,383,598 | B1 | 5/2002 | Fullerton et al. |
| 6,418,048 | B1 | 7/2002 | Sin et al. |
| 6,462,641 | B1 | 10/2002 | Dieny et al. |
| 6,762,954 | B1 | 7/2004 | Edelstein |
| 6,947,319 | B1 | 9/2005 | Edelstein |
| 7,196,957 | B2 * | 3/2007 | Tran et al. ............ 365/171 |
| 7,233,142 | B1 | 6/2007 | Edelstein |
| 7,523,251 | B2 | 4/2009 | Nemat et al. |
| 7,733,600 | B2 * | 6/2010 | Endo et al. ............ 360/99.15 |
| 7,791,829 | B2 | 9/2010 | Takeo et al. |
| 8,222,898 | B1 | 7/2012 | Edelstein |
| 8,228,717 | B2 * | 7/2012 | Liu et al. ............ 365/158 |
| 8,325,442 | B2 | 12/2012 | Koui |
| 8,755,153 | B2 | 6/2014 | Kudo et al. |
| 8,824,200 | B1 * | 9/2014 | Edelstein ............ 365/158 |
| 9,030,780 | B2 | 5/2015 | Edelstein |
| 9,047,881 | B2 | 6/2015 | Edelstein |
| 2002/0008948 | A1 | 1/2002 | Sasaki et al. |
| 2002/0047145 | A1 | 4/2002 | Nickel |
| 2002/0068195 | A1 | 6/2002 | Lundstrom |
| 2008/0102320 | A1 | 5/2008 | Edelstein et al. |
| 2009/0201614 | A1 | 8/2009 | Kudo et al. |
| 2010/0053795 | A1 | 3/2010 | Kudo et al. |
| 2010/0079910 | A1 | 4/2010 | Nagasawa et al. |
| 2011/0007431 | A1 | 1/2011 | Braganca et al. |
| 2011/0038081 | A1 | 2/2011 | Contreras et al. |
| 2011/0149428 | A1 | 6/2011 | Franca-Neto et al. |
| 2011/0205667 | A1 | 8/2011 | Yamada et al. |
| 2012/0254952 | A1 | 10/2012 | Rudolph |
| 2012/0307404 | A1 | 12/2012 | Braganca et al. |
| 2013/0070367 | A1 | 3/2013 | Igarashi et al. |

OTHER PUBLICATIONS

Takaura, N, "A GeSbTe Phase-Change Memory Cell Featuring a Tungsten Heater Electrode for Low-Power, Highly Stable, and Short-Read-Cycle Operations," Electron Devices Meeting, 2003. IEDM '03 Technical Digest. IEEE International, Page(s): 37.2.1-37.2.4, Date of Conference: Dec. 8-10, 2003.

Guler, Urcan, et al., "Local Heating with Lithographically Fabricated Plasmonic Titanium Nitride Nanoparticles," American Chemical Society Publications, Nano Lett., 2013, 13 (12), pp. 6078-6083, DOI: 10.1021/nl4033457 Publication Date (Web): Nov. 26, 2013.

Takemura, R., et al. 2Mb SPRAM Design: Bi-Directional Current Write and Parallelizing-Direction Current Read Schemes Based on Spin-Transfer Torque Switching, IEEE Journal of Solid-State Circuits, vol. 43, No. 1, Jan. 2008.

Kawahara, T., et al., "Spin-transfer torque RAM technology: Review and prospect," Microelectronics Reliability 52 (2012) 613-627.

Worledge, D.C., et al., "Spin torque switching of perpendicular Ta CoFeB MgO—based magnetic tunnel junctions," Applied Physics Letters 98, 022501; doi: 10.1063/1.3536482 (2011).

Hughes, H., "Radiation Studies of Spin-Transfer Torque Materials and Devices," IEEE Trans. on Nuclear Science, vol. 59, No. 6, p. 3027 (2012).

Fujitsu Develops Technology Enabling Higher Density Spin-Torque Transfer MRAM, Jun. 2010. http://www.fujitsu.com/global/about/resources/news/press-releases/2010/0617-01.html.

King, W., et al., "Design of atomic force microscope cantilevers for combined thermomechanical writing and thermal reading in array operation," J. of Microelectromechanical Systems, vol. 11, No. 6, p. 765, Dec. 2002.

Lu, Y., "Metglas thin film with as-deposited domain alignment for smart sensor and actuator applications," Appl. Phys. Lett. 70, 526 (1997).

* cited by examiner

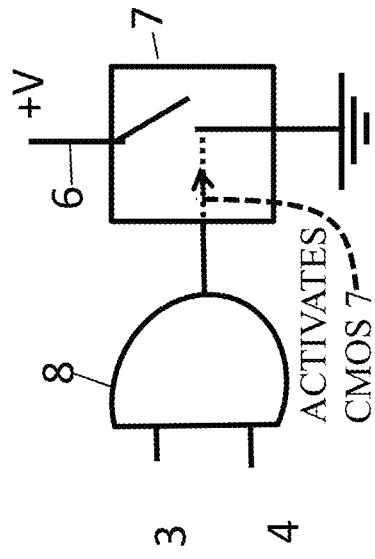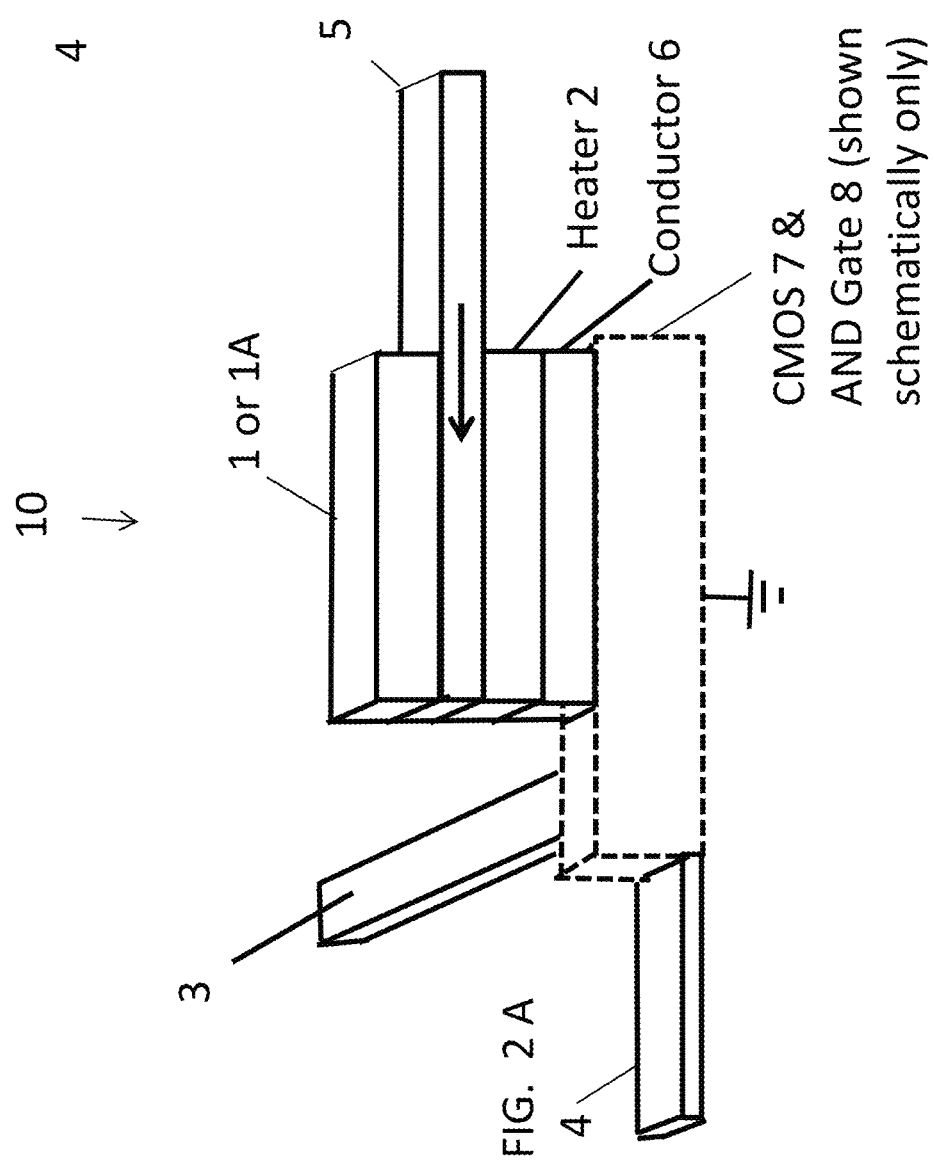

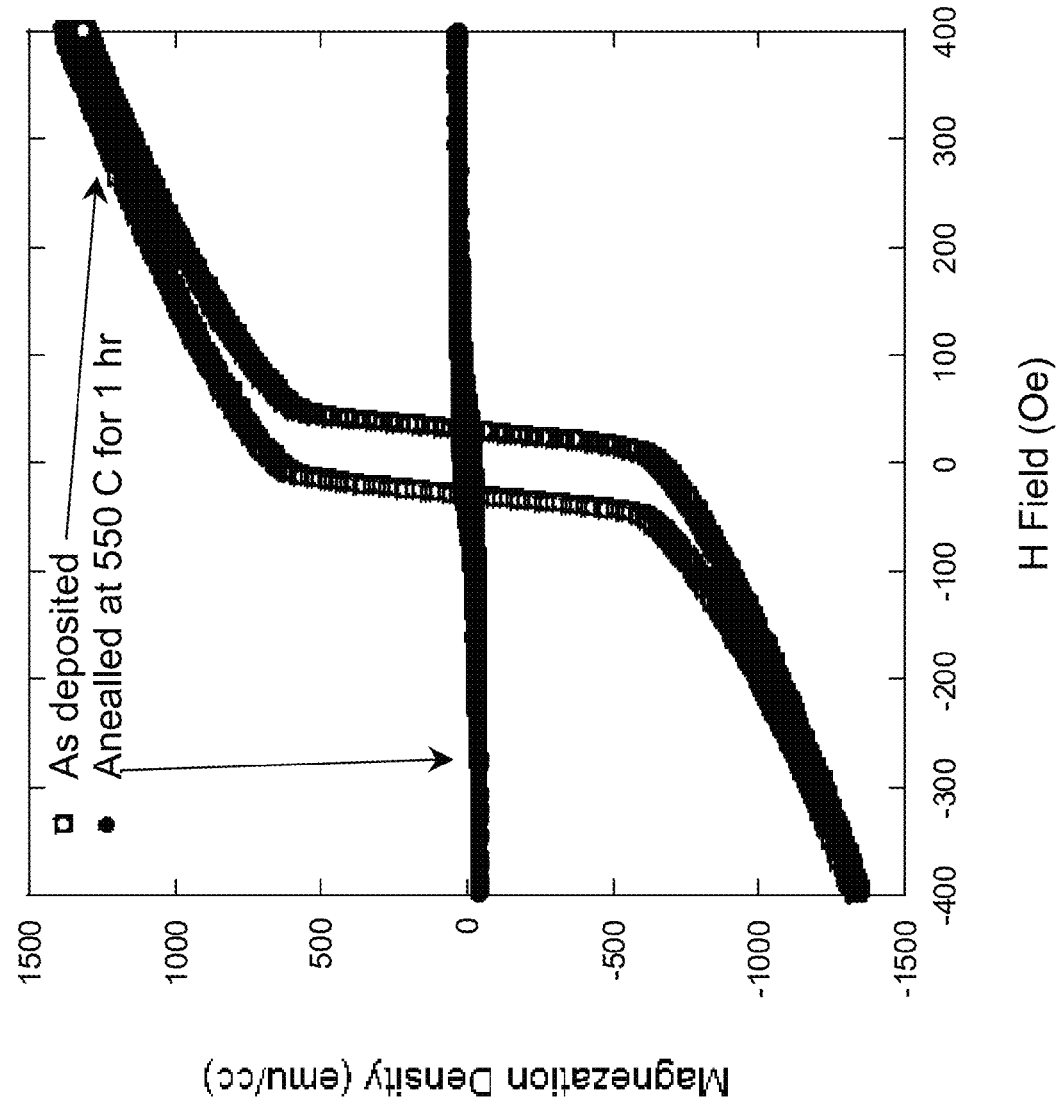
FIG. 4 Effect of heating on the magnetization of a Cu/permalloy bilayer.

Percentage change in the magnetoresistance from sweeping an MTJ reader (a) over three 10 μm wide permalloy lines that had been deposited on glass and (b) over three 50 μm wide crystallized Metglas lines written thermally with a laser into an amorphous Metglas film. The reader was at a fly height d of 5 μm and the probe field was 32 Oe.

Schematic of a portion of the circular disk. The current pulse electronics and switches are on the disk. Only a small portion of the disk showing 6 bits is shown.

| 3 | | 5 | 3 | 10 or 30 |
|---|---|---|---|---|
| 31 | 5 | | 3 | |
| 3 | 5 | | | 5 |
| 10 or 30 | | 5 | 31 | |

Unit that will be repeated 16 F2
Area per bit is 8F2

FIG. 11

NONVOLATILE MEMORY CELLS PROGRAMABLE BY PHASE CHANGE AND METHOD

CROSS REFERENCE TO RELATED APPLICATIONS

This application is a continuation-in-part application of and claims priority to U.S. patent application Ser. No. 14/109,398, U.S. Pat. No. 8,824,200, entitled "Nonvolative Memory Cells Programmable by Phase Change," by Dr. Alan S. Edelstein, filed Dec. 17, 2013, herein incorporated by reference in its entirety.

STATEMENT OF GOVERNMENT INTEREST

The invention described herein may be manufactured, used, and licensed by or for the United States Government without the payment of royalties.

BACKGROUND OF THE INVENTION

Programming of memory cells can be accomplished by changing the phase of materials, i.e., from amorphous to crystalline state. The publication entitled "OUM—A 180 nm Nonvolatile Memory Cell Element Technology For Stand Alone and Embedded Applications" by Stefan Lai, et al., Intel Corp., Santa Clara, Calif., February 2001, Proceedings of: Electron Devices Meeting, 2001, IEDM Technical Digest International, IEEE Xplore (2001), herein incorporated by reference, discusses the development status of the memory cell element of OUM (Ovonic Unified Memory)—a chalcogenide based, phase-change nonvolatile, semiconductor memory technology involving phase changing materials. OUM is a nonvolatile memory that utilizes a reversible structural phase change between amorphous and polycrystalline states in a GeSbTe chalcogenide alloy material. Because of the very small size, temperature steps required to form the elements do not compromise transistor performance. During the amorphizing reset pulse, the temperature of the programmed volume of phase-change material exceeds the melting point which eliminates the polycrystalline order in the material. The crystallizing set pulse is of lower amplitude and sufficient duration (12-50 ns) to maintain device temperature in the rapid crystallization range for a time sufficient for crystal growth.

The publication entitled "A GeSbTe Phase-Change Memory Cell Featuring a Tungsten Heater Electrode for Low-Power, Highly Stable, and Short-Read-Cycle Operations" by N. Takaura, et al, International Electron Devices Meeting; IEEE, 897-900 (2003) ISBN 0780378725) (herein incorporated by reference, features a Germanium-Antimony-Tellurium (GeSbTe) memory cell with a tungsten heater electrode. The cell has a reset current (50/spl mu/A) for the phase-change memory device.

SUMMARY OF THE INVENTION

The present invention is directed to, inter alia, a preferred embodiment memory which may be arranged in the form of an array of cells, each cell comprising a ferromagnetic region having a magnetic permittivity which changes from a first state to a second state of lower permittivity upon heating; a heater operatively associated with the ferromagnetic region which selectively provides heat to the ferromagnetic region to lower its permittivity; and a plurality of conductors operatively connected to the heater and adapted to be connected to a current source that provides a current which causes the heater to emit heat to change the ferromagnetic region from a first state to a second state.

The array of cells may further comprise logic circuitry operatively connected to the at least one heater and the plurality of connectors wherein the logic circuitry is configured to allow current to flow to the at least one heater. The logic circuitry may comprise an AND gate operatively connected to the plurality of connectors and at least one switch operatively connected to the output of the at least one AND gate such that activation of the at least one AND gate closes the at least one switch which allows current to flow to the at least one heater.

The array of cells may be configured on a disk. The ferromagnetic region may comprises one of a Cu/Ni bilayers, Metglas, alternating layers of copper and nickel or alternating layers of copper and permalloy.

Optionally, each cell may comprise a magnetic field sensor and a detector of resistance to determine the states of the array of memory cells. The magnetic field sensor may comprise an antiferromagnet layer, a free ferromagnetic layer wherein magnetization is free to rotate, and a fixed magnetic layer, the free ferromagnetic layer and the fixed magnetic layer being separated by a thin oxide layer through which electrons tunnel, the tunneling resistance being minimized when the magnetizations of the free ferromagnetic layer and the fixed magnetic layer are parallel to one another. The voltage differential of the magnetic field sensor may be determined by passing a current through the magnetic field sensor to determine whether the ferromagnetic region has a high or a low magnetic permeability.

The present invention is also directed to a method of recording data comprising providing an array of memory cells, each cell comprising at least one ferromagnetic region having permittivity which changes from a first state to a second state of lower permittivity upon heating and a heater operatively associated therewith; and recording data by heating the at least one ferromagnetic region with the heater to change the states of the at least one ferromagnetic region from a first state to a second state of lower permittivity.

BRIEF DESCRIPTION OF THE DRAWINGS

The foregoing and other objects, features, and advantages of the invention will be apparent from the following more detailed description of the preferred embodiments of the invention, as illustrated in the accompanying drawings, wherein:

FIG. 2A is a schematic illustration of a preferred embodiment memory cell 10 showing the structure of the 2-state device.

FIG. 2B is a schematic diagram showing the Cmos 7 and AND gate 8 components of FIG. 2A.

FIG. 4 is a graphical illustration showing the effect of heating on the magnetization of a Cu/permalloy bilayer.

FIG. 11 is a schematic illustration of an alternate preferred embodiment arrangement in which the preferred embodiments 10 or 30 may be arranged in an array in which heat sinks are strategically positioned.

Figure 1:
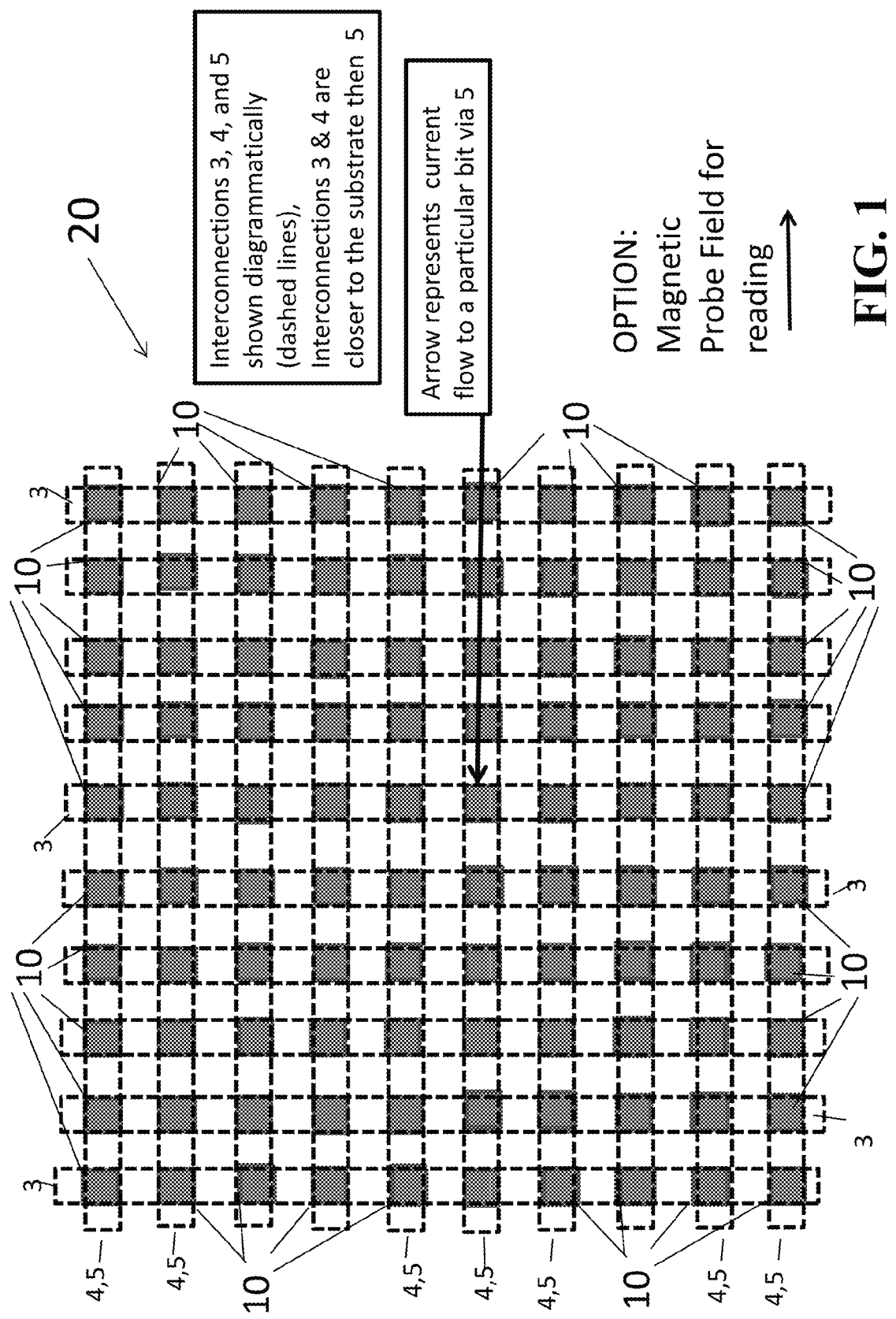
FIG. 1 is a schematic illustration of an example of a preferred embodiment comprising a 10×10 array of memory cells, each one of which can be written by sending a current through the appropriate combination of horizontal and vertical connecting electrodes.

A more complete appreciation of the invention will be readily obtained by reference to the following Description of the Preferred Embodiments and the accompanying drawings in which like numerals in different figures represent the same structures or elements. The representations in each of the figures are diagrammatic and no attempt is made to indicate actual scales or precise ratios. Proportional relationships are shown as approximates.

DESCRIPTION OF THE PREFERRED EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention. Rather, these embodiments are provided so that this disclosure will be thorough and complete, and will fully convey the scope of the invention to those skilled in the art. In the drawings, the dimensions of objects and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as an object, layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. For example, when referring first and second elements, components, regions, layers and/or sections, these terms are only used to distinguish one element, component, region, layer or section from another region, layer or section.

Furthermore, relative terms, such as "lower" or "bottom" and "upper" or "top," may be used herein to describe one element's relationship to other elements as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region or object illustrated as a rectangular will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

The present invention provides, inter alia, a method for fabricating a two state nonerasable memory on, for example, approximately a 20 nm scale. The invention presents a novel way to write and read information in a form of memory that is radiation hard. The information is stored in the form of bits that have either a high or a low magnetic permeability. Depending on the choice of materials, as will be discussed below the low, it may be possible to convert low permeability bits to high permeability bits. If the bits are originally composed of bilayers or multilayer of Cu and a ferromagnetic such as Ni or permalloy, heating will cause diffusion of the Cu into the ferromagnet and the permeability will be lowered. This diffusion is a non-reversible process. If the bits are composed of an amorphous material, it may be possible to heat and cool the material fast enough that the original amorphous, high permeability state is recreated.

Figure 10:
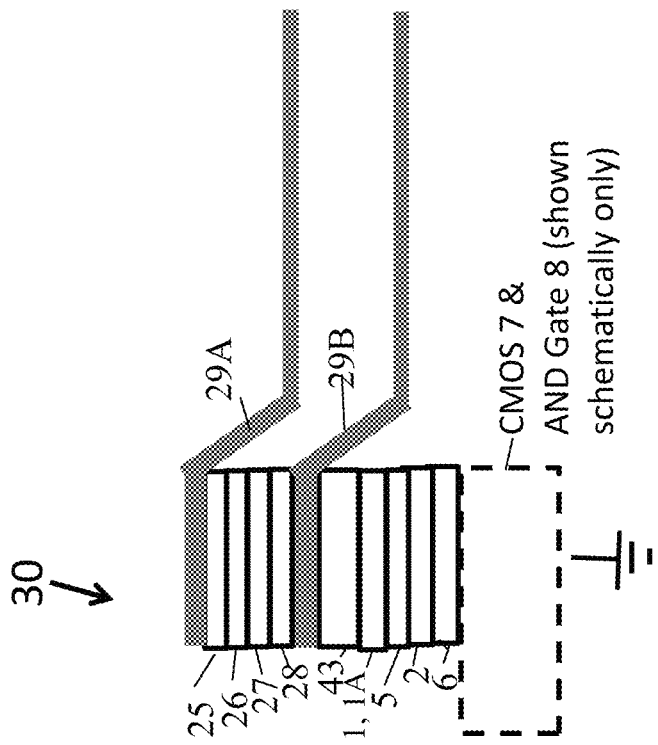
FIG. 10 is a schematic illustration of the bit with a magnetic tunnel junction (MTJ) reader at the position of the bit. The MTJ reader can be either just an MTJ sensor or a spin transfer torque (STT) RAM device.
Figure 12:
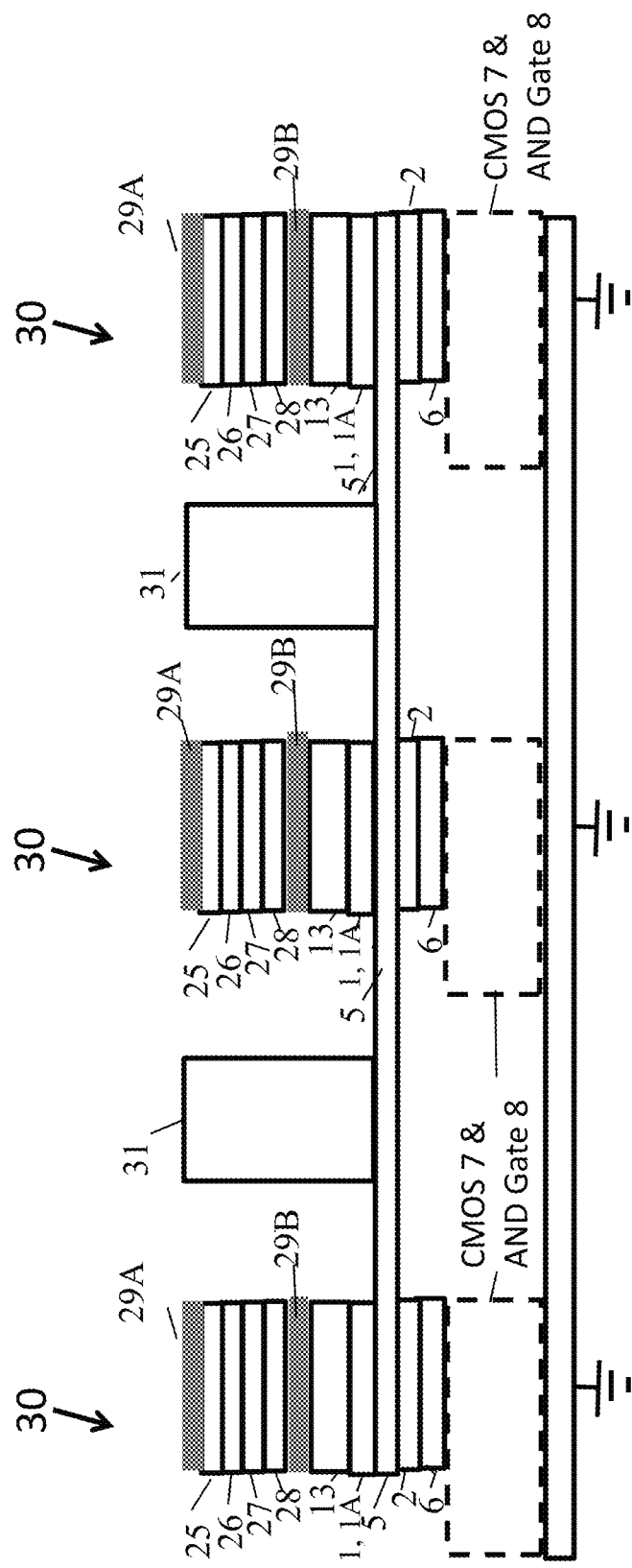
FIG. 12 is a side view of a portion of the embodiment of FIG. 11.

The high permeability bits may comprise, for example, alternating layers of copper and a ferromagnetic such as permalloy. Individual bits can be heated via crossed electrodes separated by a heater element such as titanium nitride. Heating the copper/ferromagnetic layers causes copper atoms to diffuse into the ferromagnet. This diffusion decreases the magnetic permeability of the bit. The permeability of the bit can be read by using a probe magnetic field and passing a magnetic sensor such as a magnetic tunnel junction over the bit. Optionally, there can be a magnetic sensor located at each bit as shown in FIG. 10. The sensor will detect whether the bit absorbs flux lines or does not absorb flux lines. Radiation, lightening, or intense electromagnetic pulses will not cause the amount of atomic motion as will be caused by heating. Thus, the media is radiation hard and will not be damaged by lightening or intense electromagnetic pulses. The information density may be as high as is theoretically possible, i.e., 4F2, if heat sinks, shown in FIGS. 11 and 12, could be avoided.

Referring to FIG. 1, shown is an array 20 of memory cells 10 interconnected by connections 3, 4 and 5. Electrodes 3, 4 and 5 are used to power the heater at selected bit sites. Which particular vertical electrode 3 and horizontal electrodes 4 and 5 are connected to the power source is determined by switches not shown in the figure. Underneath the magnetic bit is a AND gate CMOS switch used to turn on a heater current to a particular bit. These elements are shown in FIGS. 2A and 2B. The current flow being shown by an arrowhead. E-beam lithography may be used to fabricate the devices and each memory cell bit 1 or 1A can be 20 nm in both width and length. The write operation on cells 10 occurs by turning on the current through the CMOS via the AND gate by sending in signals on electrode 3 and 4, as depicted in FIG. 2B. The current through the CMOS passes though the logic AND gate, the heater, and the electrode 5. The heat changes the magnetic properties of the ferromagnetic layer (magnetic bit) 1.

Figure 3:
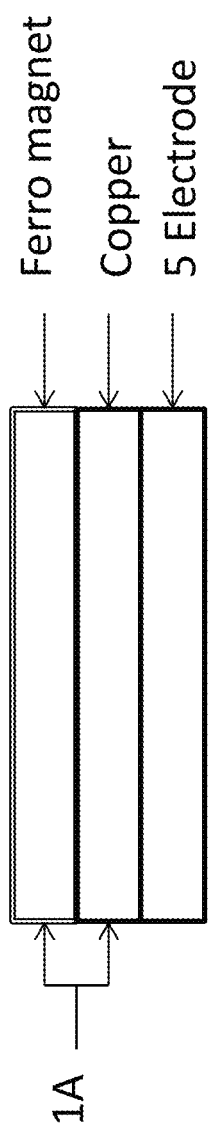
FIG. 3 is a schematic side view of an alternate preferred embodiment memory showing an electrode and ferromagnetic bit layer 1A. Shown is a single bilayer 1A, but the bilayer can be repeated to make a multilayer.

Shown in FIG. 2 is a ferromagnetic layer 1 or 1A composed of materials such as permalloy or Metglas, a conductor 5, a heater element 2, which may comprise titanium nitride, for example, a conductor 6, a CMOS 7, AND gate 8, and electrodes 3, 4, and 5. The CMOS 7 and AND gate 8 are shown schematically only and are not drawn to scale. The current through the heater 2 can raise the temperature of the ferromagnetic material of the magnetic bits 1 to 700° C. Examples of ferromagnetic material that can be used are permalloy and nickel. The ferromagnetic bit 1 may consist of either a single bilayer of a ferromagnet such as permalloy and copper or the bilayer shown may be repeated to make a multilayer, as depicted in FIG. 3. Permalloy is typically approximately an 80 at % Ni, 20 at % Fe alloy. Using a multilayer will increase the amount of material and, hence the magnetization and the signal. Alternatively one can use Ni or Metglas instead of permalloy. Electrodes 3, 4 and 5 pass current through the heating element associated with a particular bit. By adjusting the magnitude of the current and its duration, one can raise the temperature of a soft magnetic material such as Metglas above its glass temperature or cause the copper to diffuse into the ferromagnetic materials in the bilayer or multilayers. Examples of ferromagnetic material that can be used are permalloy and nickel. The time dependence of the pulse is also important. If the pulse turns off more quickly, more current is needed to reach the same temperature and to cause the same amount of diffusion. If the ferromagnetic is an amorphous material such as Metglas and if the pulse is turned off in millisecond, the soft magnetic material cools and will crystallize, thereby having a lower permeability. The advantage of this approach is that one can setup a fabrication process to produce large numbers of identical, blank memory chips, in order to minimize cost. The chips can then be written in a different lower cost system without the need of expensive lithography. Once written, the chips can be read by using a probe magnetic field and a magnetic tunnel junction reader or a spin transfer torque reader in a read head to measure how the bits modify the magnetic flux lines of a probe magnetic field. The reader may or may not be part of the media. When using a moving read head, the read head either moves over the media or the media is moved under the read head. Readers with the needed smaller dimensions have already been fabricated by many companies. Alternatively, one can have a magnetic sensor located near each sensor as shown in FIG. 10.

There are alternative methods for writing the media or creating the tunable permeable layer 1. Specifically the media or tunable permeable layer 1 can be a bilayer or multilayer of copper and nickel or a bilayer or multilayer of copper and permalloy, as shown schematically in FIG. 3. In this case, heating the bilayer 1 or multilayer will cause the copper and nickel or permalloy to alloy and the resulting alloy will be non-magnetic or less magnetic. This approach will be used in creating a read only memory.

The percentage change in tunneling magneto resistance (TMR) will be measured by sweeping the reader over the media. As an example for reading micron sized media, the reader may have a fly height d of 5 microns and the probe field $H_{probe}$=32 Oe. Smaller fly heights will be required for high density media.

Using a different optional design that allows for heating to higher temperatures and faster cooling, the tunable portion 1 of an amorphous ferromagnetic material can revert to its original permeability. The tunable permeability portion 1 may comprises soft magnetic material, e.g., Metglas, that has a high magnetic permeability when it is amorphous and a low magnetic permeability when it is crystalline. The electrodes 3 and 4 will allow the current to pass through the heating element associated with a particular bit. By passing a current through the heater 2, and by adjusting the magnitude of the current, one can raise the temperature of the soft magnetic material above its glass temperature. By using a higher current, one can melt the amorphous material. The time dependence of the pulse is also important. If the pulse turns off in millisecond, the soft magnetic material cools and will crystallize and have a lower permeability. If the heat melts the Metglas and the pulse turns off in microseconds and the cooling rate is high, the soft magnetic material will revert to being amorphous and have a large permeability. In other words, if the cooling is slow, the magnetic portion of the memory cell 10 will be in a crystalline state with a low magnetic permeability irrespective of whether a current is applied thereafter, similar in effect to a write once, read only memory comprising 20 nm non-erasable bits.

As discussed above, a current through the heater 2 can be used to modify the permeability of the tunable permeability ferromagnetic layer 1. Tunable ferromagnetic layer 1 is a ferromagnetic material whose permeability may be changed by heating. As a result of the changeable natures of the ferromagnetic layer 1, the cell 10 may have one of 2 states at a given time.

Optionally, heat sinks may be utilized so that neighboring bits are not affected by the writing. The heat sinks 31 shown in the FIG. 11 can be, for example, pillars of Cu. If this is done the array consists of unit that will have an area of 16F2 and there are two bits in each unit, as depicted in FIG. 11. Thus, the area per bit is 8F2.

Method of Reading the States with an Applied Field

A magnetic tunnel junction (MTJ) reader, as described in U.S. patent application Ser. No. 13/725,473, filed Dec. 12, 2012, entitled "Nonvolatile Corruption Resistant Magnetic Memory and Method Thereof," herein incorporated by reference, is sensitive to the modification of a probe magnetic field caused by changes in the permeability of small regions. The state of a bit can be read in two very different ways. One way it can be read is measuring its affect on a probe field. The effect on a probe field can be read by having a magnetic read head pass over the bit. Alternatively, there can be a magnetic sensor located near each bit. Another way the bit can be read, is by measuring how the bit responds to a probe field or to a torque supplied by a spin polarized current.

The following is a description of measuring the effect of the state of the bit on the probe field. In the preferred embodiment 10 as shown in FIG. 2, if there is an applied probe field, the state of the preferred embodiment 10 will affect the probe field in its vicinity. The effect of the ferromagnetic layer or magnetic bit 1 or 1A on the probe field will depend on whether the bit has a high or a low magnetic permeability. If the ferromagnetic layer or magnetic bit 1 or 1A is in its high permeability state, it will decrease the probe field in its vicinity more than if it is in a low permeability state. If the ferromagnetic layer or magnetic bit 1 or 1A is in its low permeability state, it will have a smaller effect on the probe field. The response to the probe field and hence the states can be read by passing a small constant current through a magnetic tunnel junction and measuring the voltage. The field probe 11 can be in a read head. Alternatively, there can be a separate field source.

The following is a description of the method in which one uses the effect of a field or spin polarized current on the bit that is in direct contact with an MTJ that is field sensor of part of an spin transfer torque (STT) RAM, as illustrated schematically in FIG. 10. The response of the ferromagnetic layer or magnetic bit 1, 1A to an applied field or a torque from a spin polarized current will depend on whether it is it has a high or low permeability. If the ferromagnetic layer or magnetic bit 1, 1A is in its high permeability state, it will be affected by the probe field. If the bit 1, 1A is made to have a low permeability by passing a large current through the heater element 2, it will be affected less by the probe field than if it is in the high permeability state. The response to the probe field and hence the states can be read by passing a small constant current through a magnetic tunnel junction and measuring the voltage. It will also affect the switching in an STT RAM device as shown in FIG. 10.

When the ferromagnetic layer or magnetic bit 1, 1A is hard (after crystallization) and has a larger coercivity, it takes a larger current to switch the magnetization of the free layer.

A phase changing operation (akin to tunable permeability) is described in 'GeSbTe Phase-Change Memory Cell Featuring a Tungsten Heater Electrode for Low-Power, Highly Stable, and Short-Read-Cycle Operations" by N. Takaura, et al., herein incorporated by reference. A phase-change from an amorphous state to a crystal state was defined by a DC switching voltage, $V_{switch}$ and a DC switching current, $I_{switch}$. The DC "switching" voltage and current are related to the power per unit volume required for the phase-change, p;

$$p = \frac{I_{switch} V_{switch}}{A \cdot T} = \frac{V_{switch}^2}{R \cdot A \cdot T} = \frac{V_{switch}^2}{\rho \cdot T^2}$$

where A is sample area, T is sample thickness, R is sample resistance, and ρ is sample resistivity. One of ordinary skill in the art could determine the appropriate current/power requirements utilizing the above equation.

Calculations have been done required to heat a 40×40×20 nm volume ferromagnetic layer or magnetic bit 1, 1A using a TiN heater to 400 C in 1 mil sec. Neglecting heat loss due to conduction and convection, an order of magnitude estimate would be that it will take on the order of 1 micro amp.

Alternate Embodiment/Method for Rewriting the Bits

By controlling the temperature of the chip and pulse shape of the current used for writing one can facilitate the writing process and possibly cool the chip quickly enough that the tunable permeability layer 1 will be quenched in the amorphous state; i.e., the ferromagnetic layer or magnetic bit 1, 1A will revert from the crystalline state to an amorphous state. The parameters that can be optimized are the tunable permeability material, thicknesses of the layers, temperature of the chip, and amplitude and pulse shape of the heating pulse.

When using Cu/Ni bilayers or multilayers, the ferromagnetic layer or magnetic bit 1, 1A (See FIG. 3) will become nonmagnetic if heated because diffusion will cause the Ni atoms to have too many Cu neighbors. Ni atoms become nonmagnetic in Ni/Cu alloys when they have too many Cu atoms. The change is irreversible. When Metglas is amorphous, it has a high permeability and a small coercivity. If Metglas is crystalline it has a low permeability and a higher coercivity. If one chooses Metglas, the t ferromagnetic layer or magnetic bit 1, 1A will crystallize if heated to 500° C. It will be possible, but difficult, to return the Metglas to the amorphous state. Thus, these choices for the tunable ferromagnetic layer will lead to a non-erasable memory. If one uses $Ni_{0.75}Fe_{0.25}$, one has a rewritable memory. Material for ferromagnetic layer or magnetic bit 1, 1A that are rewritable include Finemet (an alloy of Fe, Zr, Nb, Hf, B, and Cu), other versions of permalloy such as Nanoperm and Hitperm. If the ferromagnetic layer or magnetic bit 1, 1A cools quickly, it becomes a disordered alloy and the permeability is much larger than if one slowly cools and the material crystallizes into the compound $Ni_3Fe$. Heating the tunable ferromagnetic layer 1, 1A, without affecting the MTJ, can be facilitated by providing an air space of 2 to 100 nm between the MTJ and the extra layers. Though extra power is required in what has been described above, heating is already utilized in heat assisted magnetic recording HAMR to allow the use of materials with higher anisotropy in order to increase the thermal stability.

Radiation Hard Memory

A preferred method and embodiment for radiation hard memory comprises a method for writing and reading a high density, write once, read only radiation hard memory in which the information is stored in the form of high and low magnetic permeability bits 1, 1A. As described in connection with FIG. 2. the low permeability bits 1, 1A are written by applying pulses to electrodes 3, 4 which opens the AND gate 8 allowing current from the CMOS 7 to flow through a heater 2 to raise the temperature and cause diffusion in a multilayer structure that "poisons" the magnetic properties. The reading is done by using a magnetic tunnel junction to detect how the permeability of the bits affects a probe magnetic field. The films used for the memory are tens of nm thick and will not diffuse very much when they are exposed to radiation. Thus, the differences in the magnetic permeability of the material can be used to store information as a radiation hard memory. Bilayers of Cu and permalloy are heated to greatly decrease the magnetic permeability of the permalloy and the changes can be read in the magnetic permeability. Gamma radiation will not decrease the magnetic permeability as much as heating the bilayers 1A. Large amounts of information may be stored that will not be effected in the event of a nuclear event, lightening, or electromagnetic pulses, nor will it be affected in space (used on satellites). The data can be as a dense as lithography will allow, i.e., $8F^2$ as shown in FIG. 11.

The term radiation hard used here means not affected adversely by exposure to ionizing radiation (total dose) effects from a cobalt-60 (60Co) gamma ray source or affected by lightening or intense current pulses. The gamma radiation test is described in MIL-STD-883J.

FIG. 3 is a schematic side view of an alternate preferred embodiment memory of a multilayer structure showing an electrode and ferromagnetic bit layer 1A. The ferromagnetic bit layer 1A may comprise either a single bilayer 1A of a ferromagnet such as permalloy and copper or the bilayer can be repeated to make a multilayer. The bilayer/multilayer 1A may be substituted for the layer 1 in the embodiments of FIGS. 1, 2, 10, 11 and 12. Permalloy is typically approximately an 80 at % Ni, 20 at % Fe alloy. Using a multilayer will increase the amount of material and, hence the magnetization and the signal. Alternatively, Ni can be used instead of permalloy. Several materials, i.e., titanium nitride or nichrome, can be used for the heater 2. The structure shown can be fabricated using sputtering and lithography. The ferromagnetic bit can be heated to 700° C. by passing a current through the CMOS 7 by actuating the AND Gate using the terminals of the AND gate 8 connected to electrodes or conductors 3 and 4. Connector or conductor 6 in turn connects to electrode 5. Closure of the CMOS 7 (depicted as a switch in FIG. 2B) provides current to the heater as current flows through the electrode 5 when the path to the ground is completed by closure of the switch or CMOS 7 (represented in the open position in FIG. 2B). As an example, the heater is a 100 nm square of titanium nitride that is 100 nm thick. TiN films thicker than 50 nm have resistivities of around 30 $\mu\Omega$ cm. The resistance of the heater is 300$\Omega$. Thus, a very, small current will deliver considerable heating power. The exact current needed to reach 700° C. depends on the energy dissipation via conduction and dissipation which is hard to estimate. The resistance can be adjusted by changing the thickness. Heating will cause the atoms in the bilayer to mix because of diffusion. This mixing will decrease the magnetic permeability and saturation magnetization of the ferromagnetic.

Data is presented in FIG. 4 showing the effect of heating on the magnetic properties of a 100 nm Cu/50 nm permalloy bilayer. Annealing the bilayer has greatly decreased magnetic permeability of the bilayer. Generally, once the permeability has been reduced by heating it cannot be reversed. The permeability of the high permeability bits can be decreased at any time by applying a suitable current pulse. The media on which memory cell 10 is mounted is radiation hard after exposure to Co60 gamma radiation. Proof of the radiation hardening is found in H. Hughes et al. IEEE Trans. On Nuclear Science, Vol. 59, No. 6 (2012). Since the layers of the preferred embodiments herein are much thicker, ferromagnetic layer or magnetic bit 1, 1A should be more impervious to this gamma radiation.

Reading the Media

Figure 5A:
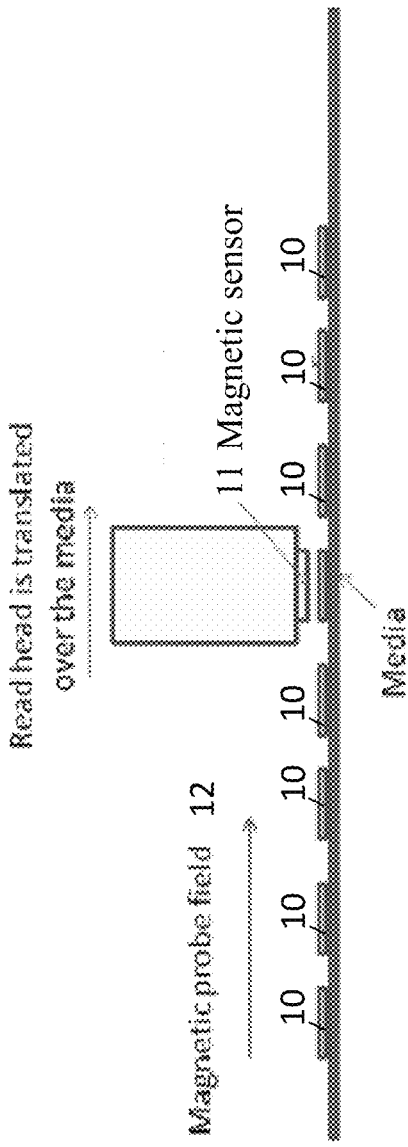
FIG. 5A is a schematic illustration depicting the reading of a bit using a magnetic sensor 11.

The media can be read by using a probe field and a method for detecting the changes in the probe field by placing a magnetic sensor directly over the media. The reader is shown in FIG. 5A. The magnetic sensor 11 shown in FIG. 5A can be a magnetic tunnel junction (MTJ) or a spin transfer oscillator. MTJ sensors are devices whose resistivity depends on the magnetic field. One measures the voltage as a constant current passes through the device. The voltage changes as the magnetic field changes. As in standard read heads, the read head is translated over the media at a small (nm) fly height.

Figure 5B:
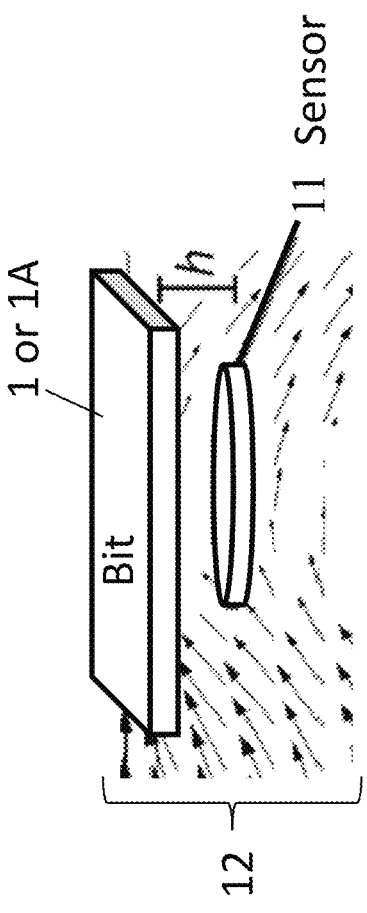
FIG. 5B is a schematic Illustration depicting how the magnetic flux lines of the probe field are altered by a high permeability bit. The magnetic sensor detects the decrease in flux.

FIG. 5B diagrammatically depicts how the flux lines of the probe field 12 are drawn into a high permeability material and that, because of this, the sensor sees a smaller field. Note that the position of the bit 1 relative to the sensor 11 is reversed from the positions shown in FIG. 5A. As the ferromagnetic layer or magnetic bit 1 or bilayer bit 1A passes through a magnetic field 12, if the bit is in a high permeability state, the magnetic flux will be drawn towards the ferromagnetic layer or magnetic bit 1, 1A, thus reducing the field sensed by the magnetic sensor 11.

Figure 6:
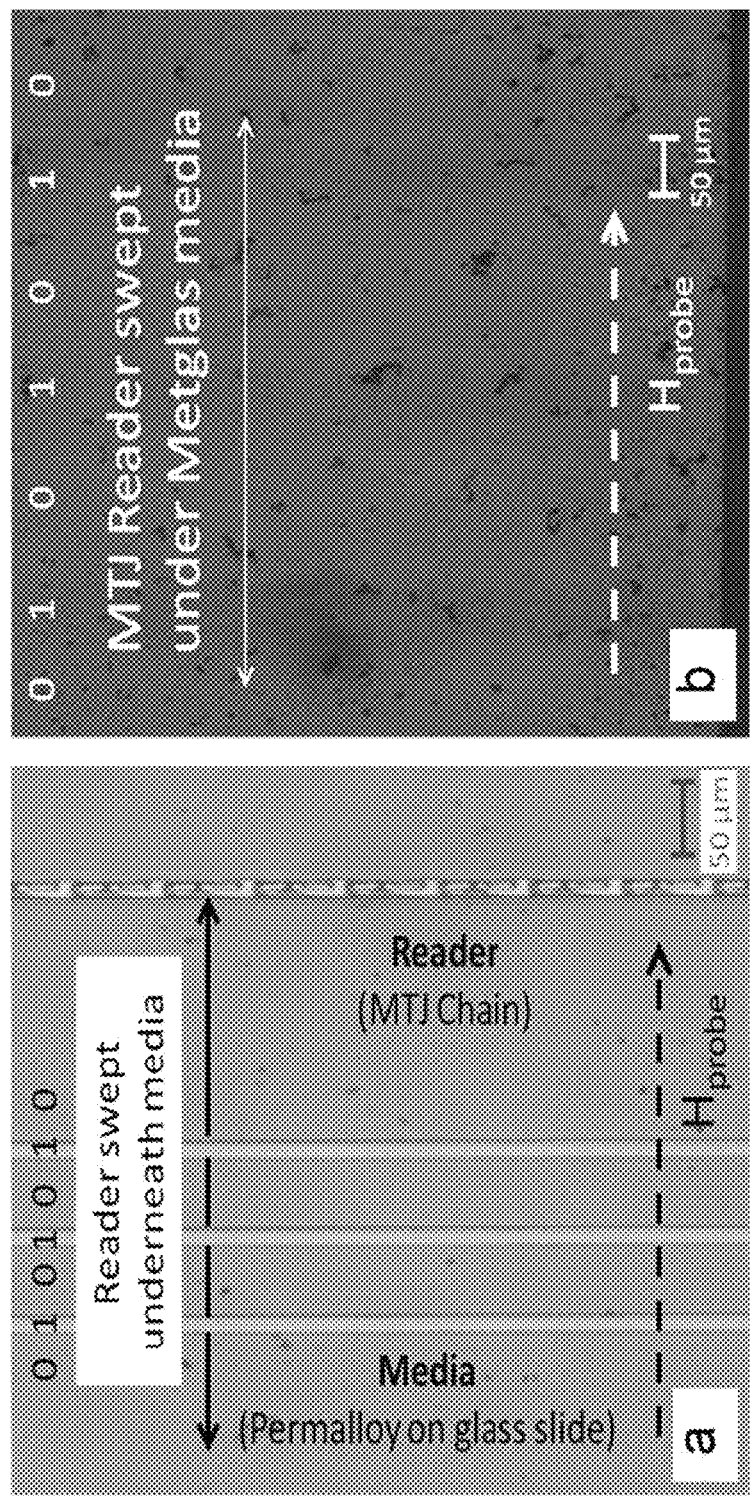
FIG. 6 illustrates lines of test samples with lines of different permeability.

FIG. 6 illustrates test samples of material with different magnetic permeability. Part (a) shows lines of permalloy with higher permeability than the glass substrate. FIG. 6 part (b) shows lower permeability lines of crystalline Metglas written thermally with a laser in amorphous, higher permeability Metglas.

Figure 7:
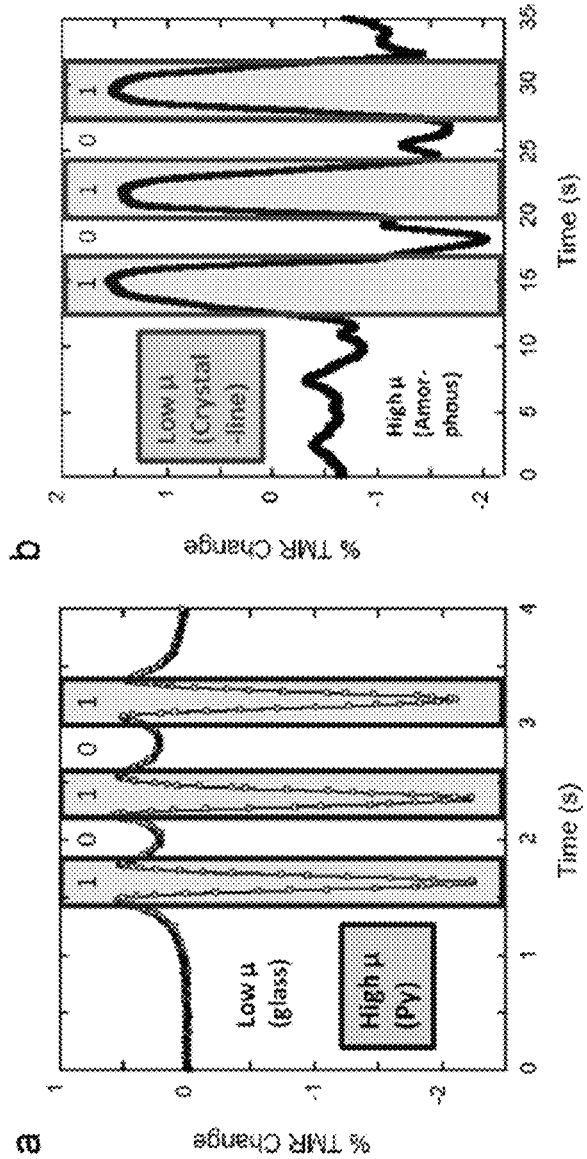
FIG. 7 illustrates the percentage change in the magneto resistance from sweeping an MTJ reader (a) over three 10 μm wide permalloy lines and (b) over three 50 μm wide crystallized Metglas lines. The reader was at a fly height d of 5 μm and the probe field was 32 Oe.

FIG. 7 shows data taken on the samples shown in FIG. 6 demonstrating changes in the magnetoresistance of an MTJ in the presence of a probe field that occurs when it is translated over a media containing lines with different permeability. More specifically, FIG. 7 illustrates the percentage change in the magnetoresistance from sweeping an MTJ reader (a) over three 10 $\mu$m wide permalloy lines and (b) over three 50 $\mu$m wide crystallized Metglas lines. The reader was at a fly height d of 5 $\mu$m and the probe field was 32 Oe.

Figure 8A:
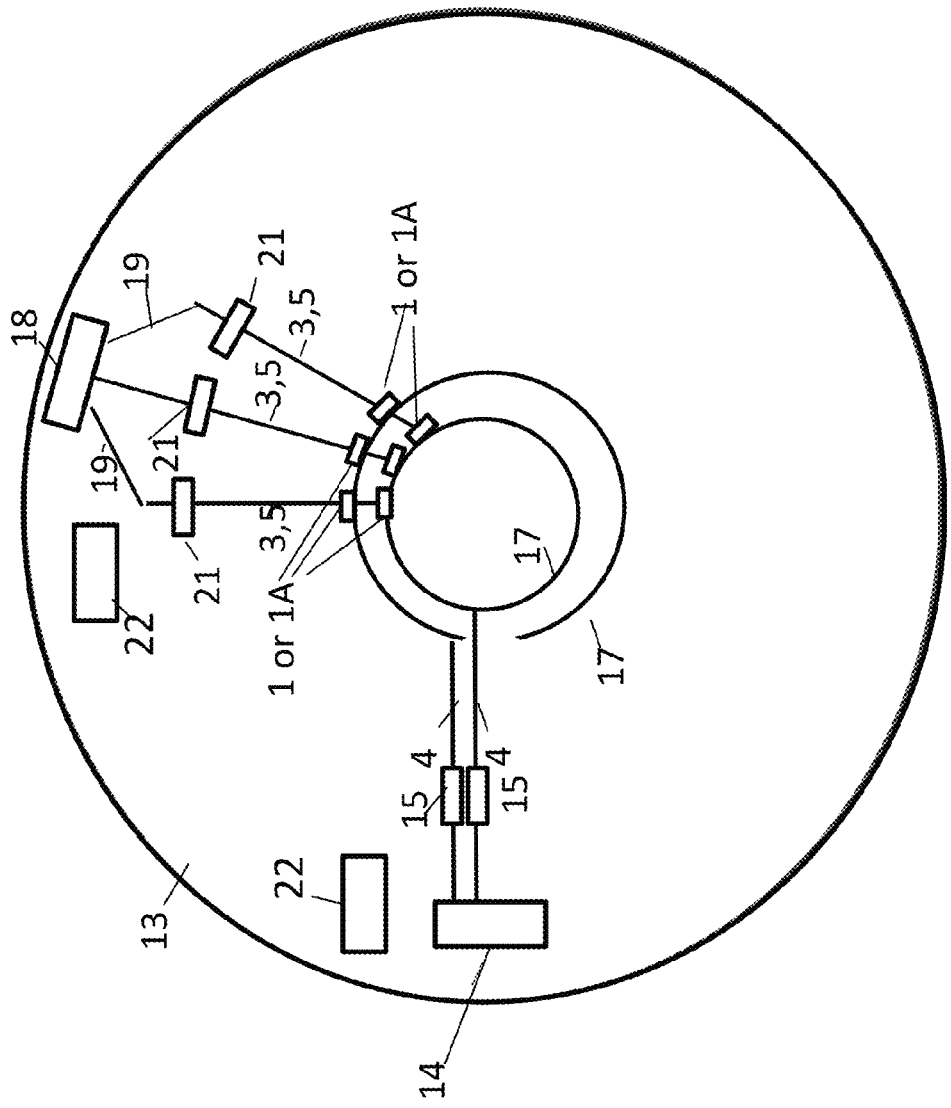
FIG. 8A is a schematic illustration of an alternate preferred embodiment showing implementation in a disc configuration in which the electronics for doing the writing is on the disc.
Figure 8B:
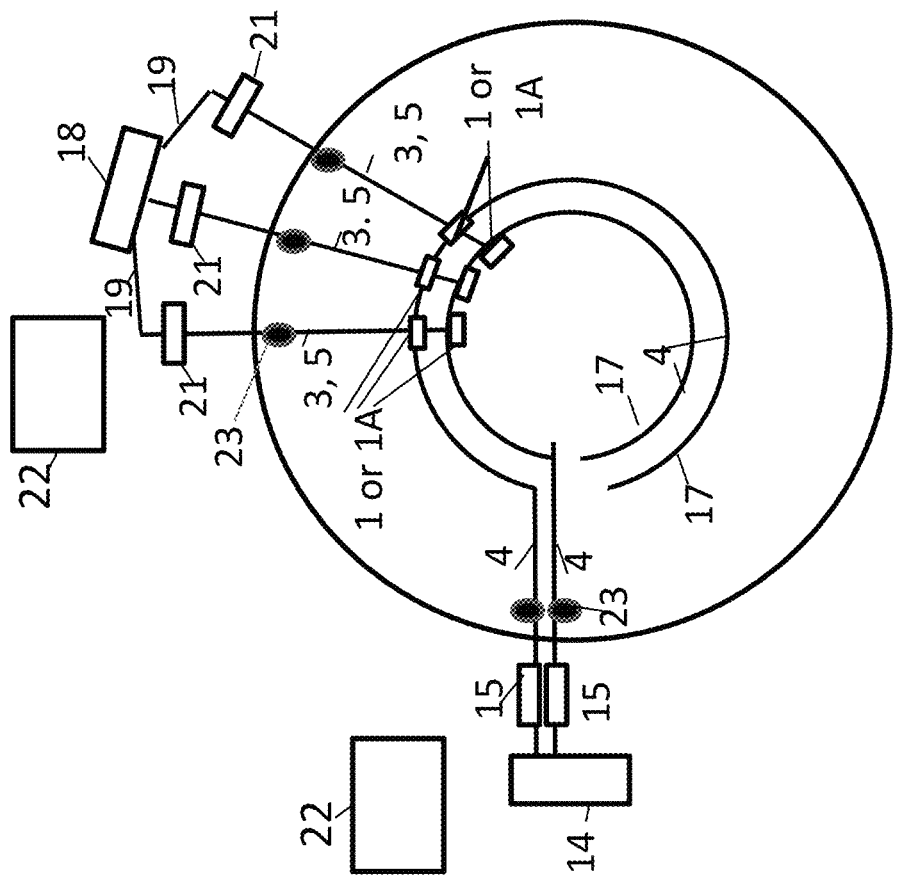
FIG. 8B is a schematic illustration of an alternate preferred embodiment showing implementation in a disc configuration in which the electronics for controlling the writing is separate from the disc.

FIGS. 8A and 8B are schematic illustrations of alternate preferred embodiments showing implementation in a disc configuration, such as, for example, on a silicon circular disk 13. The electronics for doing the writing can be on the disc as in FIG. 8A or the electronics can be a separate unit that is connected via electrodes 23 and contacts as shown in FIG. 8B. Individual bits are written by sending voltage pulses to the AND gates. Only a small portion of the disk showing 6 bits is shown in FIGS. 8 A and 8 B. Lithography may be used to fabricate the electrodes, electronic switches 15 and 21, radiation hard bits on the circular disk as shown in FIG. 8. The current sources are the CMOS. For micron-sized memory, masks, optical lithography, and a variety of photoresist techniques may be utilized. To achieve nanometer-size memory, e-beam lithography may be used. The materials may be deposited by sputtering. The electrodes and switches are used to apply current pulses from CMOS current sources that are part of the electronic writing system described in FIGS. 2A and 2B to heat specific bits 1 or 1A (bilayered or multilayered). Switch circuitry 15 and 21 is connected by lines 3, 4 to the AND gates 8, positioned at each cell location as shown in FIGS. 2A and 2B. Circular contacts 17 are configured to connect lines 4. Electrode 5 that is part of the path for the heater current is above electrode 3. Switch circuitry 14 and 18 is connected to the switches 15 and 21 (by connector 19) which operate to transfer a pulse to the AND gates 8 at a programmed time. Switches 21, 15 are connected by lines 3, 4 to the AND gates 8. Lines 3, 4 and 5 function in the same manner as to electrodes 3, 4 and 5 shown in FIGS. 1 and 2.

When a writing operation performed on disk 13, the disk 13 inserted into an electronic system that can apply voltage pulses of, at most, a few milliseconds to the control electrodes (lines 3, 4) on the disk. The voltages may be a few millivolts. Pulse generators 14 and 18 are controlled by processor 22. Processor 22 controls switches 21, 15 that control the AND gates 8. Under control of the processors 22, using the pulse generators 14 and 18. Pulse generator 18 is connected to switches 21 via lines 19. Depending on the bit selected, voltage pulses are simultaneously applied to specific switches 21 and 15 in order to actuate the AND gates 8 (shown in FIG. 2) to turn on the heater current that will reduce either the permeability of the permalloy bits 1, 1A and/or their saturation magnetization (Ni bits). Note there is an individual heater for each individual bit as shown in FIG. 2. The direction of current flow in an example bit is shown in FIG. 1.

FIG. 8B differs from FIG. 8A in that electrodes or contacts 23 are used to connect externally mounted electrical switches 21 and switches 15 to the disc. Electrical switches 15, 21 determine which AND gate 8 is actuated and hence which bit gets a current pulse.

Reading the Media

Figure 9:
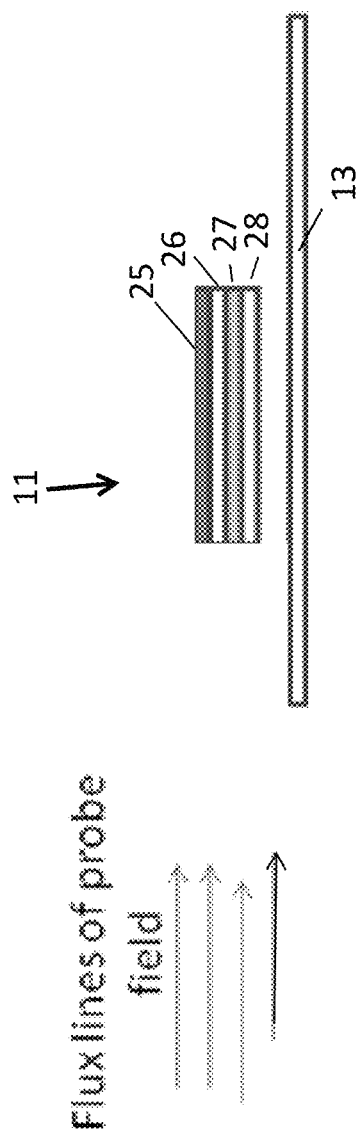
FIG. 9 is a schematic illustration of a magnetic permeability reader utilized to read the permittivity of bits 1 and 1A.

The media on the disk 13 can be read by placing the media in a reader system that can spin the disk 13 under a read head as in a hard disk computer system. The reader system also contains a magnetic sensor that is either a magnetic tunnel junction (MTJ) or a spin transfer oscillator. As represented in FIG. 5A, the disk 13 will spin 5 to 20 nm from the magnetic sensor 11. The reader system will also have a coil system carrying a current or a permanent magnetic that provides a magnetic field of 10 to 100 Oe directed in the plane of the disk. This field passes by the magnetic sensor. The magnetic sensor reads the media by detecting changes in the probe field as the magnetic sensor passes over the media as shown diagrammatically in FIG. 5B. The radial position of the read head can be changes to read bits on the different circular bit tracks 17 shown in FIGS. 8A, 8B. The spatial relationships between the magnetic sensor in the read head, the magnetic bits, and the probe field are shown in FIGS. 5B and 9.

Referring now to FIG. 10, a magnetic tunnel junction sensor is positioned between electrodes 29A and 29B. Magnetic tunnel junction sensors are devices whose resistivity depends on the magnetic field. The magnetic tunnel junction comprises an antiferromagnet layer 25, an electrode/pinned or fixed ferromagnetic layer 26 having a fixed magnetization due to contact with antiferromagnet 25, an oxide tunnel barrier layer 27, and a free ferromagnetic layer 28 whose magnetization is free to rotate. The layers 26 and 28 are separated by a thin oxide layer 27 through which electrons tunnel between the two ferromagnetic layers 26 and 28. The tunneling resistance depends on the orientation of the magnetization of the free layer 28 relative to the magnetization of the fixed layer 26. This orientation depends of the magnetic field. The tunneling resistance is minimized when the magnetizations of the two ferromagnetic layers 26 and 28 are parallel to one another. By measuring the voltage, it can be determined whether the bit has a high or a low magnetic permeability as a constant current passes through the device. Positioned under the free layer 28 is the magnetic tunnel junction electrode 29B. Space 31 separates the MTJ electrode 29 from the ferromagnetic bit 1 or 1A. The voltage across the MTJ sensor (elements 25-29A,B) changes as the probe magnetic field changes because of the effect of the magnetic bit 1, 1A. Heater electrode 5 provides current to the heater 2. Conductor 6, positioned below the heater 2, operates to carry current as shown in FIGS. 2A and 2B. The CMOS 7 and AND gate 8 operate as shown in FIGS. 2A and 2B to allow the conduction of current to the heater as described above.

FIG. 11 is an illustration of an alternate preferred embodiment of the present invention. Depicted in the middle of FIG. 11 is the preferred embodiment 10 or alternate preferred embodiment 30. In the example shown in FIG. 11, one of conductors 3 or 5 are adjacent to the preferred embodiments 10 or 30, represented by squares in FIG. 11. The heat sinks 31 are arranged so as to prevent heat from being transferred via conductors 5 to the ferromagnetic bits of the neighboring embodiments 10 or 30. Note that electrodes/conductors 5 are closer to the heaters 2 of the embodiments 10 and 30 than the electrodes 3 or 4. For this reason the heat sinks 31 are used in regard to the conductors 5 but not for the conductors 3. Alternatively, instead of having a single read head, one can have a magnetic sensor near each magnetic bit as shown in FIG. 10. This will eliminate the need for relative motion between the read sensor and the bit. Because of thermal heating, it may be necessary to have a space separation denoted as a spacer 43 in FIG. 10 between the ferromagnetic layer 1 or 1A and the MTJ conductor 29B. In the case of Ni bits, if the sensor is used as an STT RAM device, one does not need to use a probe field but the spacer element 43 may not be needed. For Ni bits one can determine whether the current needed to switch the free layer has changed.

As used herein, the terminology "permittivity" as it relates to electromagnetism, is the measure of the ability of a material to support the formation of a magnetic field within itself; the degree of magnetization that a material obtains in response to an applied magnetic field. In electromagnetism, the auxiliary magnetic field H represents how a magnetic field B influences the organization of magnetic dipoles in a given medium, including dipole migration and magnetic dipole reorientation, as shown by

B=μH, where the permeability is represented by μ.

As used herein, the term "radiation hard" means not affected adversely by exposure to ionizing radiation (total dose) effects from a cobalt-60 (60Co) gamma ray source. A radiation test is described in MIL-STD-883J.

As used herein the terminology "anisotropy" means the property of being directionally dependent, as opposed to isotropy, which implies identical properties in all directions.

As used herein "Tunnel magnetoresistance (TMR)" is a magnetoresistive effect that occurs in a magnetic tunnel junction (MTJ).

As used herein, the terminology "magnetic tunnel junction" is a component consisting of two ferromagnets separated by a thin insulator; whereby by the tunnel magnetoresistance (TMR) is a measure of the ease that the electrons can tunnel through the insulating layer (typically a few nanometers thick), from one ferromagnet into the other. The junctions may be prepared by photolithography.

As used herein, the terminology "spin polarized current" relates to charge carriers (such as electrons) having a property known as spin which is a small quantity of angular momentum intrinsic to the carrier. An electrical current is generally unpolarized (consisting of 50% spin-up and 50% spin-down electrons); a spin polarized current is one with more electrons of either spin. By passing a current through a magnetic layer, one can produce a spin-polarized current. If a spin-polarized current is directed into a magnetic layer, angular momentum can be transferred to the layer, which will tend to change magnetization orientation. This can be used to excite oscillations or even flip the orientation of the magnetization.

As used herein, the terminology "anti-parallel" and "opposite" have the same meanings with respect to the magnetic polarity of the second ferromagnetic layer being substantially opposite to the magnetic polarity of the first ferromagnetic layer.

As used herein, the terminology "ferromagnetic" refers to substances that are ferromagnetic; such as for example, iron, nickel, cobalt and most of their alloys, some compounds of rare earth metals, and a few naturally-occurring minerals such as lodestone.

As used herein the terminology Metglas refers to a thin amorphous metal alloy ribbon often produced by using rapid solidification process of approximately $1,000,000°$ C./s. This rapid solidification creates an amorphous material with unique ferromagnetic properties that allows the ribbon to be magnetized and de-magnetized quickly and effectively with very low core losses of approximately 5 mW/kg at 60 Hz and maximum relative permeability approximately 1,000,000. In the present application, the Metglas can be produced by sputtering of alloys of the same compositions.

As used herein the terminology "exchange interaction" means, as defined in Wikipedia, an interaction between spins arises because the change in the direction of the spin leads to a change in electrostatic repulsion between neighboring electrons, due to a particular quantum mechanical effect called the exchange interaction. In a ferromagnet nearby spins tend to align in the same direction. The exchange interaction is related to the Pauli exclusion principle, which says that two electrons with the same spin cannot also have the same "position". Therefore, under certain conditions, when the orbitals of the unpaired outer valence electrons from adjacent atoms overlap, the distributions of their electric charge in space are further apart when the electrons have parallel spins than when they have opposite spins. This can reduce the electrostatic energy of the electrons when their spins are parallel compared to their energy when the spins are anti-parallel, so the parallel-spin state is more stable. In simple terms, the electrons, which repel one another, can move "further apart" by aligning their spins, so the spins of these electrons tend to line up. This difference in energy is called the exchange energy. Note that the direction of spin polarized current flow is the direction that the electrons are moving and is opposite to the direction of usual current flow.

The materials in which the exchange interaction is much stronger than the competing dipole-dipole interaction are frequently called magnetic materials. For instance, in iron (Fe) the exchange force is about 1000 times stronger than the dipole interaction. Therefore below the Curie temperature virtually all of the dipoles in a ferromagnetic material will be aligned. The exchange interaction is also responsible for the other types of spontaneous ordering of atomic magnetic moments occurring in magnetic solids, antiferromagnetism and ferromagnetism. There are different exchange interaction mechanisms which create the magnetism in different ferromagnetic, ferrimagnetic, and antiferromagnetic substances. These mechanisms include direct exchange, RKKY exchange, double exchange, and superexchange.

Obviously, many modifications and variations of the present invention are possible in light of the above teachings. It is therefore to be understood that, within the scope of the appended claims, the invention many be practiced otherwise than as specifically described.

What is claimed is:

1. A nonvolatile memory comprising:
    at least one ferromagnetic region having permeability which changes from a first state to a second state of lower permeability upon heating;
    at least one heater operatively associated with the at least one ferromagnetic region which selectively provides heat to the at least one ferromagnetic region to change its permeability; and
    a plurality of connectors operatively connected to the at least one heater and adapted to be connected to a current source that provides a current which causes the at least one heater to emit heat to change the permeability of the at least one ferromagnetic region from the first state to a second state.

2. The nonvolatile memory of claim 1 further comprising logic circuitry operatively connected to the at least one heater and the plurality of connectors, the logic circuitry configured to allow current to flow to the at least one heater and read circuitry operatively associated with the at least one ferromagnetic region configured to read the state of the at least one ferromagnetic region based upon the permeability of the at least one ferromagnetic region.

3. The nonvolatile memory of claim 1 further comprising at least one AND gate operatively connected to the plurality of connectors and at least one switch operatively connected to the output of the at least one AND gate such that activation of the at least one AND gate closes the at least one switch which allows current to flow to the at least one heater.

4. The nonvolatile memory of claim 1 wherein the memory is arranged as an array of memory cells, each cell comprising the at least one ferromagnetic region and the at least one heater, and wherein the plurality of connectors interconnect the memory cells.

5. The nonvolatile memory of claim 4 wherein the array is configured on a disk and wherein the plurality of connectors comprise concentric connectors positioned on the disk.

6. The memory device of claim 4 wherein the array of cells are used to store data and each cell has 2 states, each state being determined by the permeability of the at least one ferromagnetic region.

7. The memory device of claim 6 wherein whether the at least one ferromagnetic region has a first permeable amorphous state and a second state which is crystal line.

8. The memory device of claim 1 further comprising a magnetic field source and a magnetic field sensor to determine the states of the array of memory cells.

9. The memory device of claim 1 wherein the at least one ferromagnetic region comprises one of a Cu/Ni bilayers, Metglas, alternating layers of copper and nickel or alternating layers of copper and permalloy.

10. The memory device of claim 1 further comprising a magnetic field source and a magnetic field sensor comprising an antiferromagnet layer, a free ferromagnetic layer wherein magnetization is free to rotate, and a fixed magnetic layer, the free ferromagnetic layer and the fixed magnetic layer being separated by a thin oxide layer through which electrons tunnel, the tunneling resistance being minimized when the magnetizations of the free ferromagnetic layer and the fixed magnetic layer are parallel to one another, and wherein the voltage differential of the magnetic field sensor is determined by passing a current through the magnetic field sensor to determine whether the ferromagnetic region has a high or a low magnetic permeability.

11. A nonvolatile memory comprising an array of cells, each cell comprising:
  a ferromagnetic region having permeability which changes from a first state to a second state of lower permeability upon heating;
  a first layer which changes temperature upon application of a voltage operatively associated with the ferromagnetic region which selectively provides heat to the ferromagnetic region to change its permeability; and
  a plurality of conductors operatively connected to the first layer and adapted to be connected to a current source that provides a current which causes the first layer to emit heat to change the ferromagnetic region from a first state to a second state.

12. The nonvolatile memory of claim 11 wherein the array is configured on a disk and wherein the plurality of connectors comprise concentric connectors positioned on the disk.

13. The array of memory cells of claim 11 wherein when the ferromagnetic region changes to the second state, the ferromagnetic region becomes substantially crystalline in structure.

14. The array of memory cells of claim 11 further comprising logic circuitry operatively connected to the first layer and the plurality of conductors, the logic circuitry configured to allow current to flow to the first layer.

15. The array of memory cells of claim 11 further comprising an AND gate operatively connected to the plurality of connectors and at least one switch operatively connected to the output of the at least one AND gate such that activation of the at least one AND gate closes the at least one switch which allows current to flow to the first layer.

16. The array of memory cells of claim 11 further comprising a magnetic field source and a magnetic field sensor and a detector of resistance to determine the states of the array of memory cells.

17. The array of memory cells of claim 11 wherein the ferromagnetic region comprises one of a Cu/Ni bilayers, Metglas, alternating layers of copper and nickel or alternating layers of copper and permalloy.

18. The array of memory cells of claim 11 wherein the ferromagnetic region changes from a first permeable amorphous state to a second crystalline state and wherein each cell has a magnetic field sensor operatively associated therewith and wherein the array is radiation hard.

19. The array of memory cells of claim 11 further comprising a magnetic field source and wherein each cell further comprises a magnetic field sensor comprising an antiferromagnet layer, a free ferromagnetic layer wherein magnetization is free to rotate, and a fixed magnetic layer, the free ferromagnetic layer and the fixed magnetic layer being separated by a thin oxide layer through which electrons tunnel, the tunneling resistance being minimized when the magnetizations of the free ferromagnetic layer and the fixed magnetic layer are parallel to one another, and wherein the voltage differential of the magnetic field sensor is determined by passing a current through the magnetic field sensor to determine whether the ferromagnetic region has a high or a low magnetic permeability.

20. A method of recording data comprising
  providing an array of memory cells, each cell comprising at least one ferromagnetic region having permeability which changes from a first state to a second state of lower permeability upon heating and a heater operatively associated therewith; and
  recording data by heating the at least one ferromagnetic region with the heater to change the states of the at least one ferromagnetic region from a first state to a second state of lower permeability.

* * * * *